(12) United States Patent
Minami et al.

(10) Patent No.: US 6,486,716 B1
(45) Date of Patent: Nov. 26, 2002

(54) PHASE COMPENSATION CIRCUIT

(75) Inventors: Koichiro Minami, Tokyo (JP); Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/654,625

(22) Filed: Sep. 5, 2000

(51) Int. Cl.[7] ............................................... H03L 7/00
(52) U.S. Cl. ...................... 327/152; 327/161; 327/149; 327/152
(58) Field of Search ................................ 327/158, 149, 327/392, 393, 395, 3, 5, 269, 152, 153, 161; 331/12

(56) References Cited

U.S. PATENT DOCUMENTS

| 5,118,975 A | * | 6/1992 | Hillis et al. .................. 327/158 |
| 5,451,894 A | | 9/1995 | Guo ............................ 327/241 |
| 5,550,514 A | * | 8/1996 | Liedberg ..................... 331/1 A |

FOREIGN PATENT DOCUMENTS

| JP | 6-268490  | 9/1994  | .......... H03K/5/135 |
| JP | 6-303096  | 10/1994 | ........... H03H/11/26 |
| JP | 10-173496 | 6/1998  | ............. H03K/5/13 |
| JP | 10-242954 | 9/1998  | .............. H04L/7/33 |
| JP | 10-269773 | 10/1998 | .......... G11C/11/409 |
| JP | 11-55091  | 2/1999  | .......... H03K/5/135 |
| JP | 11-88153  | 3/1999  | ............. H03L/7/06 |
| JP | 11-145816 | 5/1999  | ....... H03K/19/0175 |
| JP | 6-304124  | 10/2001 | ........... H03H/11/26 |

* cited by examiner

*Primary Examiner*—Tuan T. Lam
*Assistant Examiner*—Hiep Nguyen
(74) *Attorney, Agent, or Firm*—Hayes Soloway P.C.

(57) ABSTRACT

The invention provides a phase compensation circuit that can carry out phase compensation grater than the variable delay time range of a variable delay circuit without increasing more than necessary the delay time of the variable delay circuit even in the case that the phase of the reference signal and the phase of the feedback signal change because of changes in the operating environment due to fluctuations in the power source voltage and fluctuations in temperature. The phase compensation circuit that compensates the phase of a clock signal provides a plurality of variable delay circuits, a first phase comparator that compares the phase of a reference signal to the phase of a feedback signal, a second phase comparator that compares the phases of the plurality of variable delay circuits, a switching circuit that switches the outputs of the plurality of variable delay circuits, and a control circuit. First, one among the plurality of variable delay circuits is selected as the path from the input to the output, then the output of the other variable delay circuits is controlled so as to differ from the phase of the output of the selected variable delay circuit by one cycle, and when the maximum value or minimum value of the variable delay time range of the selected variable delay circuit is reached, the output of the other variable delay circuits is switched from the path from the input to the path of the output.

3 Claims, 10 Drawing Sheets

PHASE COMPENSATION CIRCUIT

BACKGROUND OF THE INVENTION

1. Field of the Invention

The present invention relates to semiconductor integrated circuits and in particular to a circuit that compensates the phase of a periodic input signal such as a clock signal.

2. Description of the Related Art

A phase compensation circuit for clock signal is widely used in a memory and a processor etc. to compensate the phase of a reference signal and the phase of a feedback signal.

FIG. 10 is a drawing showing an example of the structure of a conventional phase compensation circuit. Referring to FIG. 10, this conventional phase compensation circuit is structured to provide a first variable delay circuit 1, in which the delay time between an input signal 100 and output signal 101 can be variably set, a first phase comparator 5 that compares the phase of a reference signal 102 and the phase of a feedback signal 103, which is the fed back output of the first variable delay circuit 1, and a control circuit 4.

The result of the comparison of the phases of the reference signal 102 and the feedback signal 103 in the first phase comparator 5 is supplied to the control circuit 4, and in the control circuit 4, based on the results of this comparison, the setting and control of the delay time of the first variable delay circuit 1 are carried out so that the phase of the reference signal 102 is the same as the phase of the feedback signal 103.

FIG. 11 is a drawing showing the relationship between the delay adjusted value of the first variable delay circuit 1 and the delay time. And shown in FIG. 11, the phase of the output of the first variable delay circuit 1 can be controlled within a variable delay time range.

Moreover, as a totally digital phase adjustment method providing a digitally adjustable delay circuit, Japanese Patent Application, First Publication, Hei 6-303096, proposes a phase shift method in which an infinitely long delay line is simulated by identifying a continuous terminal at a physical position along the delay line. In addition, Japanese Patent Application, First Publication, Hei 11-88153, discloses for example a digital DLL (delay locked loop) circuit providing a variable delay circuit that delays an input signal, a phase comparator that compares the phases of a reference signal and a feedback signal, and a counter that decrements the count value based on the output of the phase comparator and thereby controls the delay time of the variable delay circuit. Furthermore, in Japanese Patent Application, First Publication, Hei 11-55091, discloses a variable delay circuit of a DLL circuit.

However, a conventional phase compensation circuit explained referring to FIG. 11 has the following problems.

The first problem is that the range of the phase that can be phase compensated is limited. The reason is that this structure is such that the phase of the reference signal and the phase of the feedback signal are compensated using only one variable delay circuit.

That is, the variable delay circuit can change the delay time from the input terminal to the output terminal based on a control signal, but because the size of the variable delay circuit is finite (the number delay elements is limited), there exist a maximum value and a minimum value for the variable delay time.

Thus, for example, in the case that the phase is compensated when the delay time of the variable delay circuit is at the maximum value of the variable range, subsequently, when the delay time from the input signal to the feedback signal is increased due to a change in the operational environment, such as a fluctuation in the power source voltage or a fluctuation of the temperature, the variable delay circuit cannot further increase the delay time, and thus compensation of the phase becomes impossible.

Contrariwise, in the case that the phase is compensated when the delay time of the variable delay circuit is at the minimum value of the variable range, subsequently, when the delay time from the input signal to the feedback signal is reduced due to changes in the operating environment such as a fluctuation of the power source voltage or fluctuations of the temperature, the variable delay circuit cannot reduce delay time any further, and compensation of the phase becomes impossible.

The second problem is that when increasing the variable delay time range of the variable delay circuit with the object of increasing the range of the variable phase compensation range, the delay time of the variable delay circuit increases.

When the delay time of the variable delay circuit increases, the circuit becomes easily influenced by external influences such as power source noise, the jitter of the phase compensation circuit increases, and carrying out high precision phase compensation becomes difficult.

SUMMARY OF THE INVENTION

It is the object of the present invention to provide a phase compensation circuit that allows phase compensation grater than the variable delay time range of the variable delay circuit but does not increase more than necessary the delay time of the variable delay circuit even in the case that the phase of the reference signal and the phase of the feedback signal fluctuate due to changes in the operating environment such as the fluctuations in the power source voltage and fluctuations in temperature.

In order to attain this objective, the phase compensation circuit according to the present invention is characterized in providing a plurality of variable delay circuits whose output signal phases differ from each other by a specified cycle; a switching circuit that selects one variable delay circuit from among said plurality of variable delay circuits; a first comparator that compares the phase of the output signal of the currently selected variable delay circuit to the phase of a specified reference signal; and a control circuit that, based on the results of the comparison by said first phase comparator, controls the delay time of said currently selected variable delay circuit so that the phase of the output signal of the currently selected variable delay circuit agrees with the phase of said reference signal, and if the delay time after control exceeds the variable time delay range of the currently selected variable delay circuit, controls said switching circuit so as to select another variable delay circuit.

Preferably, the phase compensation circuit according to the present invention is characterized in further providing a second comparator that compares the phases of the outputs of said plurality of variable delay circuits to each other, and wherein said control circuit, based on the results of the comparison by said second comparison means, controls the delay time of said other variable delay circuits so that the phase of the output of the currently selected variable control circuit and the phase of the output of the other variable delay circuits differ by a specified cycle.

Preferably, two of said variable delay circuits are provided; and further said control circuit advances the phase of the output of the other variable delay circuits said specified cycle ahead the phase of the output of the currently selected variable delay circuit in the case that the delay time after said control is larger than the maximum value of the variable delay time range of the currently selected variable delay circuit, or contrariwise, delays the phase of the output of the other variable delay circuits said specified cycle behind the phase of the output of the said currently selected variable delay circuit in the case that the delay time after said control is smaller than the minimum value of the variable delay time range of the currently selected variable delay circuit.

Preferably, said specified cycle is one cycle or ½ cycle.

A first effect of the present invention is that even in the case that the delay time from the output signal to the feedback signal changes due to changes in the operating environment due to fluctuations in the power source voltage or fluctuations in temperature, phase compensation greater than the variable delay time range of the variable delay circuit can be carried out. The reason is that in the present invention, when the delay time of the one variable delay circuit currently selected among the plurality of variable delay circuits reaches the maximum value or minimum value of the variable time delay range, in the switching circuit the output is switched from the one variable delay circuit to another variable delay circuit whose output phase differs by one cycle from that of the one variable delay circuit, and thus phase compensation greater than the variable delay time of the variable delay circuit becomes possible.

A second effect of the present invention is that it can provide a phase compensation circuit that can carry out phase compensation without increasing more than necessary the delay time of the variable delay circuit.

A third effect of the present invention is that by making the delay time of the variable delay circuit small, jitter produced by the variable delay circuit itself can be reduced.

DETAILED DESCRIPTION OF THE PREFERRED EMBODIMENTS

Figure 1:
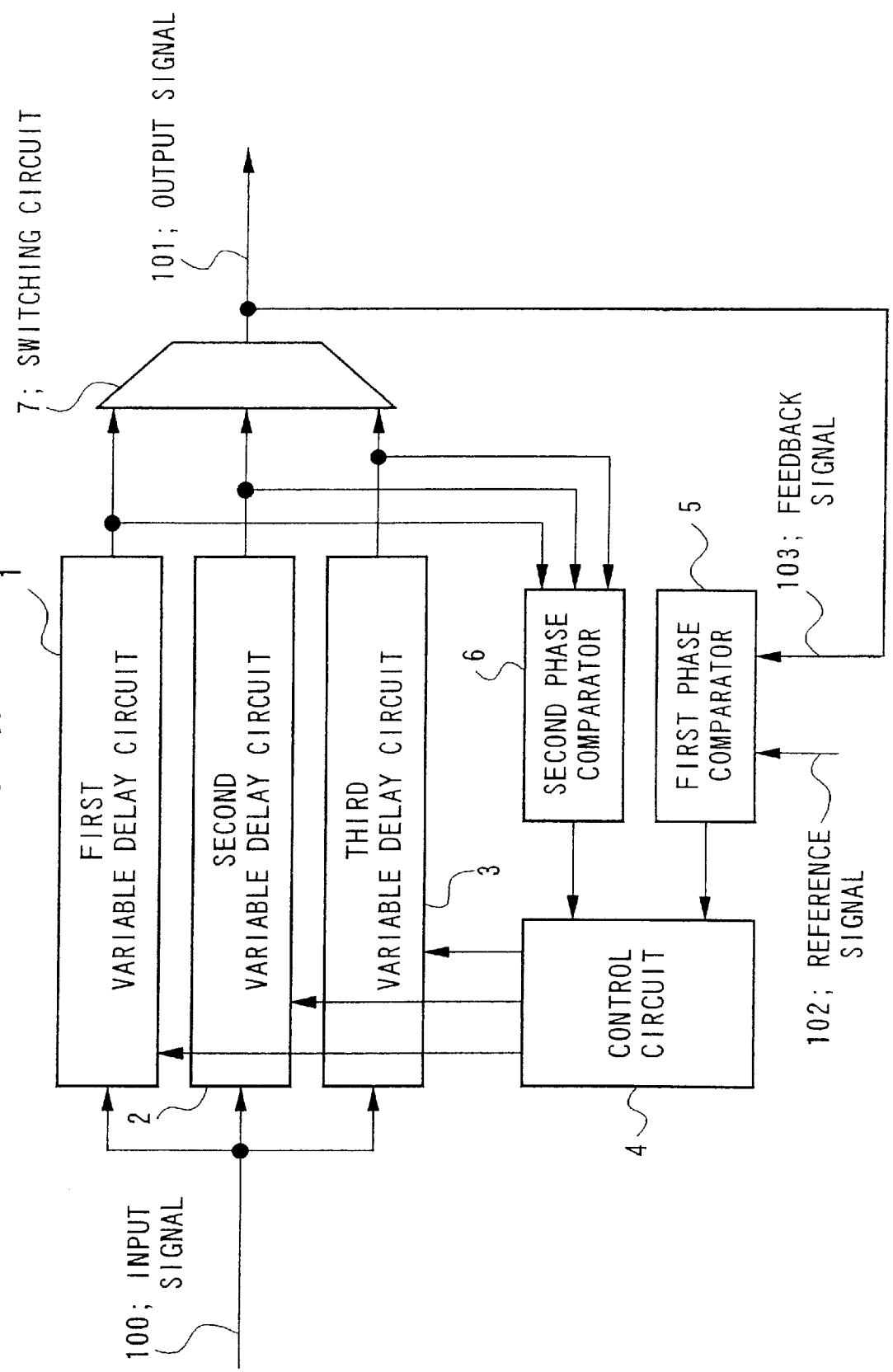
FIG. 1 is a drawing showing the structure of the first embodiment of the present invention.

The preferred embodiments of the present invention will now be explained. The phase compensation circuit of the present invention comprises a plurality of variable delay circuits, a first phase comparator that compares the phase of a reference signal to the phase of a feedback signal, a second phase comparator comprising one or a plurality of phase comparators that respectively compare the phases of two of the plurality of outputs from the plurality of variable delay circuits, and a switching circuit, which switches the output of the plurality of variable delay circuits, and wherein first one variable delay circuit among the plurality of variable delay circuits is selected as the path from the input to the output. At this time, the phase of the output of the other variable delay circuits is set and controlled so as to differ by one cycle from the phase of the output of the one selected variable delay circuit, and when the delay time of the one selected variable delay circuit reaches the maximum value or minimum value of the variable delay time range, another variable time delay circuit is selected as the path from the input to the output.

In a preferred embodiment, the phase compensation circuit of the present invention provides a plurality of variable delay circuits (1–3) that have as a common input the clock signal (100), a switching circuit (7) that switches and selects one among the outputs of the plurality of variable delay circuits and outputs this as an output signal, a first phase comparator (5) that compares the phase of a reference signal (102) and the phase of a feedback signal (103), which is the fed back output signal from switching circuit (7), a second phase comparator (6) comprising one or a plurality of phase comparators (11–13) that respectively compares the phases of two outputs among the plurality of outputs from the plurality of variable delay circuits (1–3), and a control circuit (4) that, for the one variable delay circuit currently chosen by the switch circuit (7) among the plurality of variable delay circuits (1–3) based on the output of the first phase comparator (5) and the second phase comparator (6), carries out control in such a manner that the phase of this reference signal becomes equal to the phase of this feedback signal based on the results of the comparison of the phases of the reference signal and the feedback signal in the first phase comparator (5), and for the other variable delay circuits that were not selected by the switching circuits (7) among the plurality of variable phase circuits (1–3), referring to the results of the comparison of the phases from the second phase comparator (6), carries out control such that the other variable delay circuits not selected by the switching circuit (7) are separated by only one cycle with respect to the output of the one variable delay circuit, and wherein, when the phase of the output of the one variable delay circuit and the phase of the output of the other variable delay circuits differ by only one cycle, the one variable delay circuit is switched to the other variable delay circuits and phase compensation greater than the variable delay time range of the variable delay circuit is possible. Moreover, in the case that the other variable delay circuits not selected by the switching circuit (7) cannot be separated from the phase of the output of the one variable delay circuit by one cycle, control is carried out so as to stop at the maximum value or the minimum value of the variable delay time range.

In this embodiment of the present invention, in the case that the delay time of the one variable delay circuit has reached the minimum of the variable delay time range, when the phase of the output advances further, the output of the one variable delay circuit and the output of another variable delay circuit having the same phase is selected by the switching circuit (7), and the phase is advanced more than the variable delay time range of the one variable delay circuit. In the case that the delay time of the one variable delay circuit becomes the maximum value of the variable delay time range, when the phase of the output is further delayed, the output of the one variable delay circuit and the output of another variable delay circuit having the same phase is selected b the switching circuit (7), and the phase is delayed more than the variable delay time range of the one variable delay circuit.

In this manner, according to the embodiments of the present invention, it is possible to carry out phase compensation that is greater than the delay time of the variable range of a variable delay circuit. Furthermore, it is possible to carry out phase compensation without increasing more than necessary to the delay time of the variable delay circuit.

The above-described form of an embodiment of the present invention will be explained in detail with reference to the drawings.

FIG. 1 is a drawing showing the structure of a phase compensation circuit according to a first embodiment of the present invention. Referring to FIG. 1, the first embodiment of he present invention comprises a first variable delay circuit 1, a second variable delay circuit 2, a third variable delay circuit 3, a first phase comparator 5 that compares the phase of the reference signal 102 and the phase of a feedback signal 103, a second phase comparator 6 that respectively compares the phases of the output of the plurality of variable phase circuits, a switching circuit 7 that switches the output of the first to third variable delay circuits 1–3, and a control circuit 4.

The operation of this embodiment of the present invention will now be explained. The input signal 100 is input in common into the input terminals of the first variable delay circuit 1, the second variable delay circuit 2, and the third variable delay circuit 3, and one of the outputs of each of the first, second, and third variable delay circuits 1, 2, and 3 is selected by the switching circuit 7 and output as the output signal 101.

Here, the case is explained in which the output of the second variable delay circuit 2 is selected by the switching circuit 7.

In the first phase comparator 5, a comparison of the phase of the reference signal 102 to the phase of the feedback signal 103 is carried out. Based on the results of the phase comparison by the first phase comparator 5, the control circuit 4 carries out control of the delay time of the currently selected second variable delay circuit 2 so that the phase of the reference signal 102 and the phase of the feedback signal 103 are the same.

In the second phase comparator 6, the comparison of the phase of the output of the first variable delay circuit 1 to the phase of the output of this second variable delay circuit 2 is carried out. In addition, a comparison of the phase of the output of the third variable delay circuit 3 to the phase of the output of the second variable delay circuit 2 is carried out.

Based on the result of the phase comparison output from this second phase comparator 6, the control circuit 4 carries out control of the delay time of the first variable delay circuit 1 so that the phase of the output of the first variable delay circuit 1 advances one cycle ahead of the phase of the output of this second variable delay circuit 2. In addition, the control circuit 4 carries out control of the delay time of the third variable delay circuit 3 so that the phase of the output of the third variable delay circuit 3 is delayed one cycle behind the phase of the output of the second variable delay circuit 2.

Figure 5:
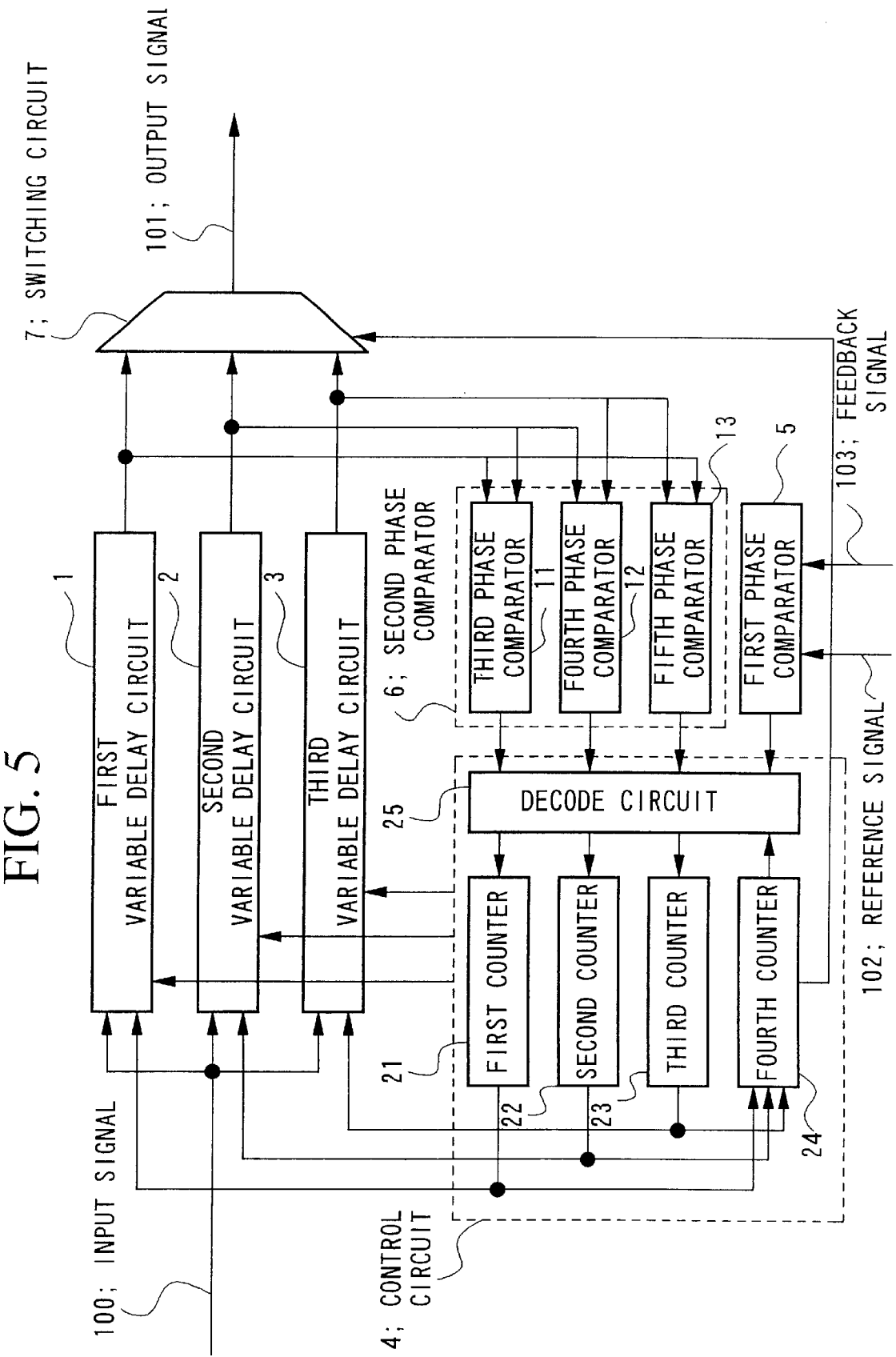
FIG. 5 is a drawing showing the details of the structure of the first embodiment of the present invention.

FIG. 5 is a drawing showing an example of the structure of a second phase comparator 6 and the control circuit 4 in the first embodiment of the present invention. Referring to FIG. 5, the second phase comparator 6 provides a third phase comparator 11 that compares the phase of the output of the first variable delay circuit 1 to the phase of the output of the second variable delay circuit 2, a fourth phase comparator 12 that compares the phase of the output of the second variable delay circuit 2 to the phase of the output of the third variable delay circuit 3, and a fifth phase comparator 13 that compares the phase of the output of the third variable delay circuit 3 to the phase of the output of the first the variable delay circuit 1, and wherein the output of the third to fifth phase comparators 11 to 13 and the output of the first phase comparator 5 are input into the decoder circuit 25 of the control circuit 4.

In the third phase comparator 11, the phase of the $n+1^{th}$ clock of the output from the first variable delay circuit 1 is compared to the phase of the $n^{th}$ clock (the clock that is one clock cycle tCK ahead of the $n+1^{th}$ clock) of the output of this second variable delay circuit 2, and the result of the comparison is output.

In the fourth phase comparator 12, the phase of the clock of the $n+1^{th}$ output from the second variable delay circuit 2 is compared to the phase of the $n^{th}$ clock of the output from the third variable delay circuit 3, and the result of the comparison is output.

In the fifth phase comparator 13, the phase of the $n+1^{th}$ clock of the output from the third variable delay circuit 2 is compared to the phase of the $n^{th}$ clock of the output from the first delay variable circuit 1, and the result of the comparison is output.

The control circuit 4 provides a decoder circuit 25 that inputs the output (the result of the phase comparison) of the first phase comparator 5 and the output (the result of the phase comparison) of the third to fifth phase comparators 11, 12, and 13 that form the second phase comparator 6, first to third counters 21 to 23 that input the output of the decoder circuit 25, and a fourth counter 24 that inputs the output of the first to third counters 21 to 23.

The value of the counter output from the fourth counter 24 represents information about the variable delay circuit selected by the switching circuit 7 among the first to third variable delay circuits 1 to 3, and is input into the decoder circuit 25, and at the same time is input into the switching circuit 7. Based on the output value of the fourth counter 24 of the control circuit 4, a switching circuit 7 switches and selects one among the outputs of the first to third variable delay circuits 1 to 3.

In addition, the output (count value) of the first to third counters 21 to 23 are respectively input into the first to third variable delay circuits 1 to 3 as control information for variably controlling the delay time.

Based on the output of the fourth counter 24, which shows the variable delay time currently selected by the switching circuit among the first to third variable delay circuits 1 to 3, the decoder circuit 25 carries out control such that the result of the phase comparison from the first phase comparator 6 is output to the counter (for example, in the case of the second variable delay circuit, the second counter 22), which controls the delay time of the variable delay circuit currently selected among the first to third counters 21 to 23. Based on the result of the phase comparison from the first phase comparator 6, this counter decrements the count value, and controls the delay time of the currently selected variable delay circuit, and thereby control is carried out such that the phase of the reference signal 102 and the phase of the feedback signal 103 agree.

At the same time, for the two remaining variable delay circuits (for example, the first and third variable circuits 1 and 3) that are not assigned to output paths, the control circuit 4 increments or decrements the count value of the two counters (for example, the first and third counters 21 and 23 correspond to the first and third variable delay circuits 1 and 3) corresponding to the remaining two variable delay circuits based on the results of the comparison of the phases of the third to fifth comparators 11, 12, and 13, and the phase of the output of the remaining variable delay circuits is controlled so as to be separated by one cycle with respect to the phase of the output of the variable delay circuit currently selected by the switching circuit 7.

As explained above, the fourth counter 24 is a counter for determining which variable delay circuit among the first to third variable delay circuits 1 to 3 is assigned to the output, and, for example, to explain a 3-bit counter, with a count value of 001, the first variable delay circuit is selected in the switching circuit 7, with a count value of 010, the second variable delay circuit 2 is selected in the switching circuit 7, and with a count value 100, the third variable delay circuit 3 is selected in the switching circuit 7, and the selected circuit is assigned to the output signal path. The fourth counter 24 shifts the count value when the delay time of the variable delay circuit assigned to the path from the input signal 100 to the output signal 101 reaches the maximum value or the minimum value.

Figure 6:
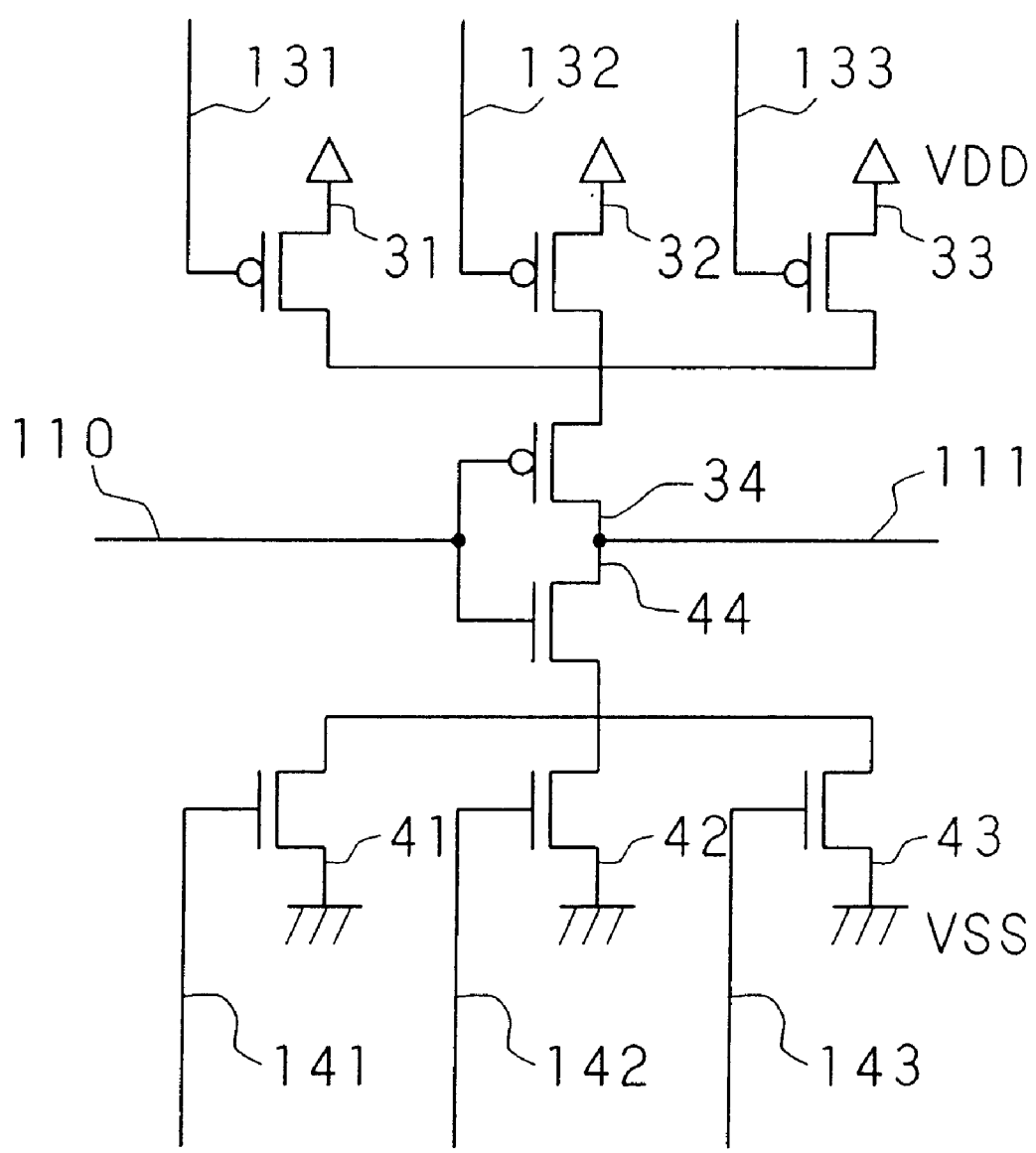
FIG. 6 is a drawing showing an example of a structure of a variable delay circuit of a first embodiment of the present invention.

FIG. 6 is a drawing showing the delay elements that form a variable delay circuit. Referring to FIG. 6, a P-channel MOS transistor 34 and an N-channel MOS transistor 44 whose gates are connected together and input the input signal 110, and whose drains are connected together and output the output signal 111, P-channel MOS transistors 31, 32, 33 which are connected in parallel between the P-channel MOS transistor 34 and the power source VDD, and input control signals 131, 1321 and 133 into their respective gates, and N-channel MOS transistors 41, 42, 43 which are connected in parallel between the source of the N-channel MOS transistor 24 and the ground VSS, and input control signals 141, 142, 143 into their respective gates, are provided. By switching the values of the control terminals 141 to 143 and 131 to 133, the number of P-channel MOS transistors and the number of N-channel MOS transistors connected between the source of the P-channel MOS transistor 34 and the power source VDD and between the source of the N-channel MOS transistor 44 and the ground VSS, can be varied, and thereby the drive current (current drive capacity) can be variably controlled and the delay time of the variable delay circuit can be varied. Specifically, the bit signal of the counter output of the first to third counters 21 to 23 and its inverted signal are respectively input as control signals 141 to 143 and 131 to 133 into the N-channel MOS transistors 41, 42, 43 and the P-channel MOS transistors 31, 32, 33 of the first to third variable delay circuits 1 to 3. For example, control is carried out such that with a counter value of 001, the P-channel MOS transistor 31 and the N-channel MOS transistor 41 are turned on, with a count value of 011, the P-channel MOS transistors 31 and 32 and the N-channel MOS transistor 41 and 42 are turned on, and with a counter value of 111, the P-channel MOS transistors 31 to 33 and the N-channel MOS transistor 41 to 43 are turned on. The first to third variable delay circuits 1 to 3 are structured with an equal number of stages of delay elements.

Figure 2:
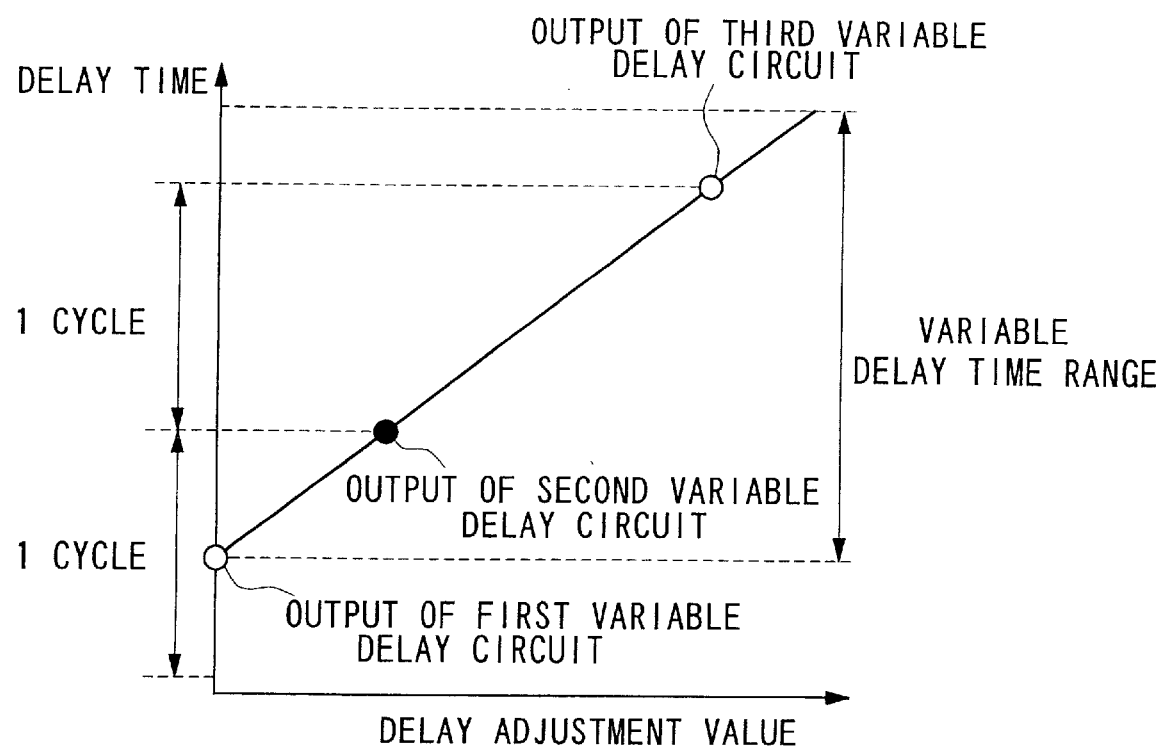
FIG. 2 is a drawing for explaining the operational characteristics of the first embodiment of the present invention.

FIG. 2 is a drawing for explaining an example of the relationship between the delay adjustment value of the variable delay circuit and the delay time in the first embodiment of the present invention. The phase of the output of the first variable delay circuit 1 is controlled so as to be advanced one cycle ahead of the phase of the output of the second variable delay circuit 2 within its variable delay time range. In addition, the phase of the output of the third variable delay circuit 3 is controlled so as to be delayed one cycle behind the phase of the output of the second variable delay circuit 2 within its variable delay time range.

Figure 3:
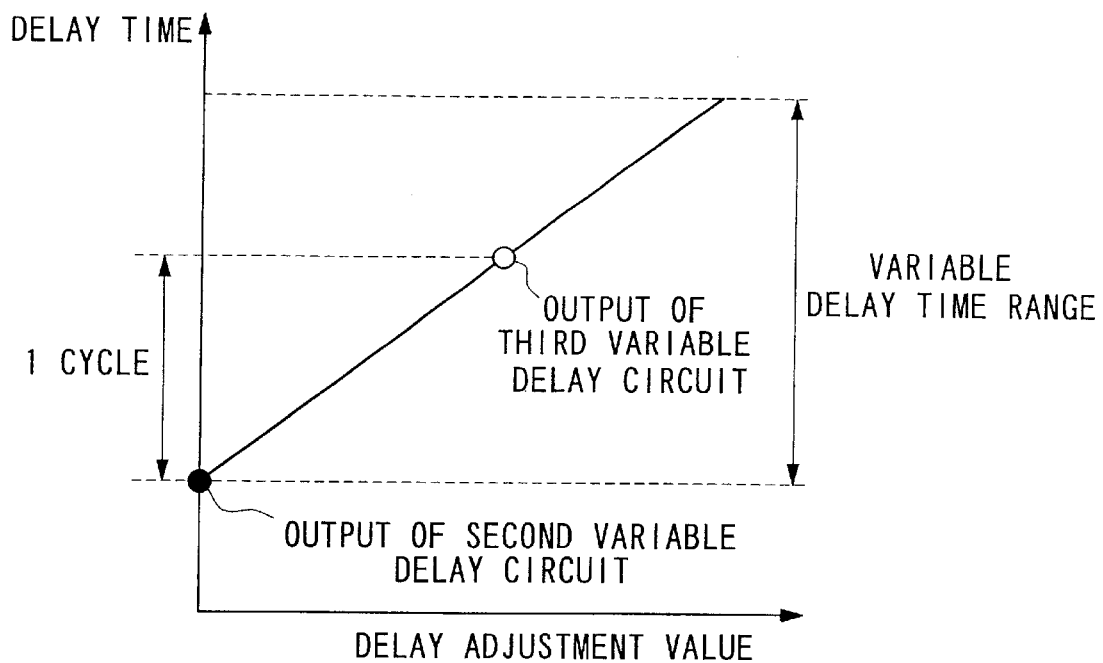
FIG. 3 is a drawing for explaining the operational characteristics of the first embodiment of the present invention.

FIG. 3 is a drawing for explaining an example of the relationship between the delay adjustment value of the variable delay circuit and the delay time in the case that the delay time of the second variable delay circuit 2 has reached the minimum value of the variable delay time range in the first embodiment of the present invention. In the case that the phase of the output of the phase compensation circuit is further advanced due to changes in the operating environment such as fluctuations in the power source voltage and fluctuations in temperature, the output of the third variable delay circuit 3, which has the same phase as the second variable delay circuit 2, is selected by the switching circuit 7. Thereby, the phase can be advanced greater than the variable delay time range of the variable delay circuit 2.

Figure 4:
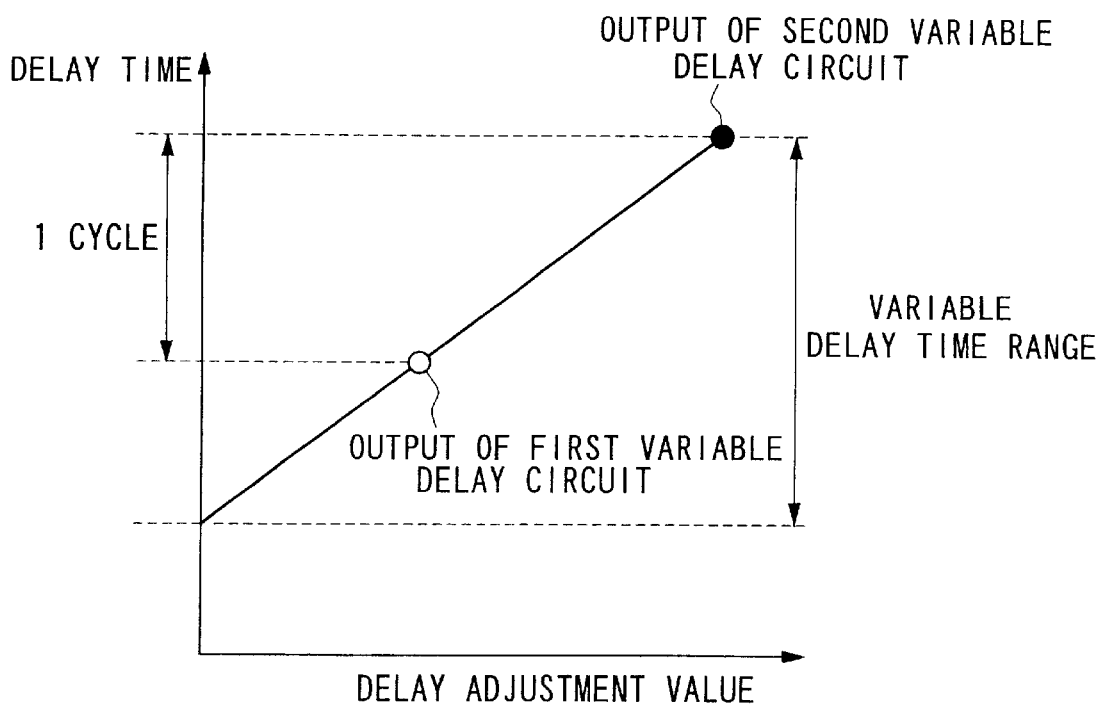
FIG. 4 is a drawing for explaining the operational characteristics of the first embodiment of the present invention.

FIG. 4 is a drawing for explaining an example of the relationship between the delay adjustment value and delay time of the variable delay circuit when the delay time of the second variable delay circuit 2 has reaches the maximum value in the variable delay time range. When the phase of the phase comparator is further delayed due to changes in the operating environment such as fluctuations of the power source voltage or fluctuations of the temperature, the output of the first variable delay circuit 1, which has the same phase as the output of the second variable delay circuit 2, is selected by the switching circuit 7. Thereby, the phase can be delayed greater than the variable delay time range of the variable delay circuit 2.

The same control is carried out both when the delay time of the first variable delay circuit 1 and the third variable delay circuit 3 respectively reach the maximum and minimum values of the variable delay time range.

In this manner, the phase compensation circuit according to the present invention can carry out phase compensation greater than the variable delay time range of a variable delay circuit. Furthermore, without increasing the delay time of the variable delay circuit more than necessary, compensation of the phase over a wide range is possible.

Figure 7:
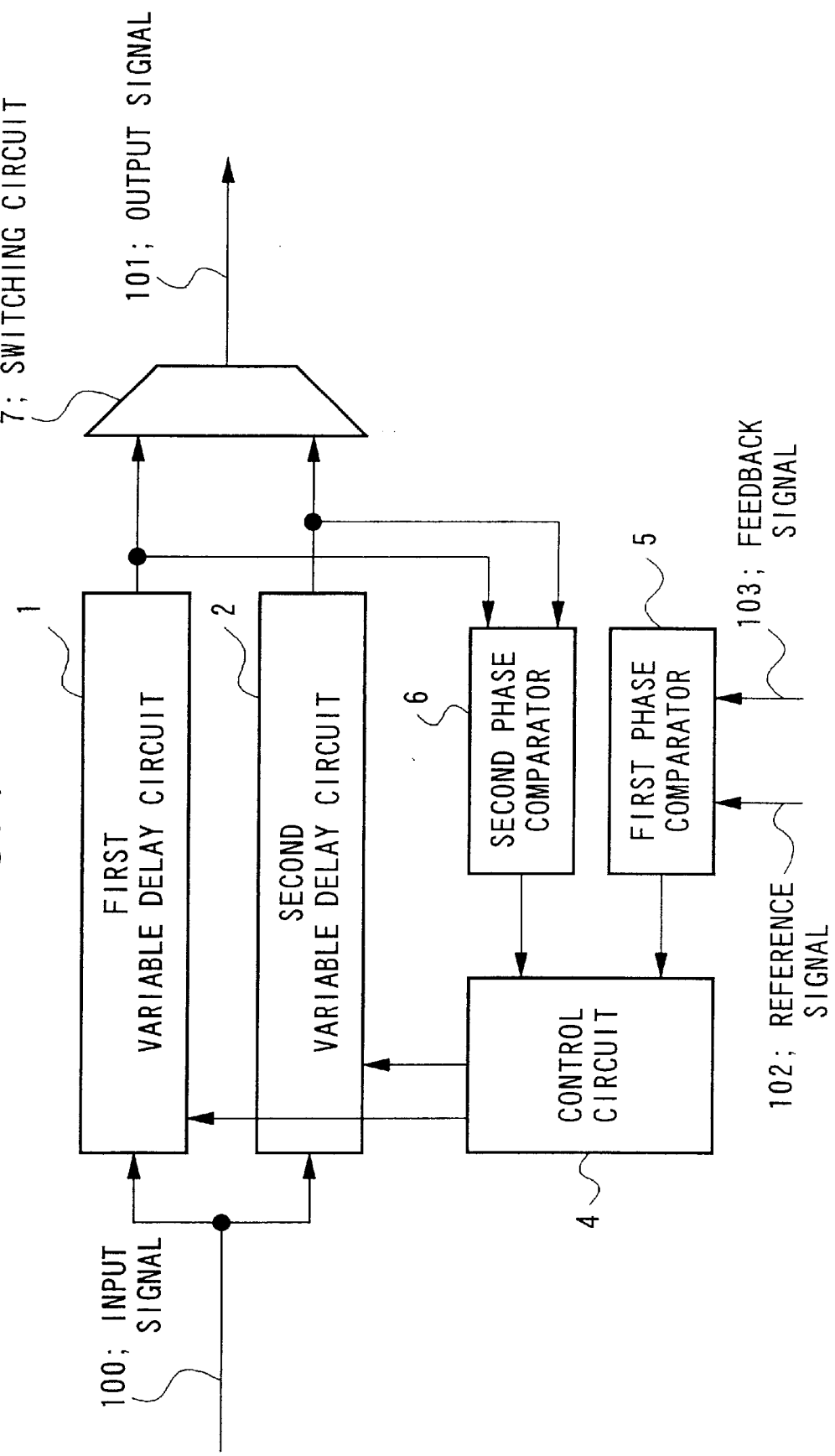
FIG. 7 is a drawing showing a second embodiment of the present invention.

Next, a second embodiment of the present invention will be explained. FIG. 7 is a drawing showing the structure of a phase compensation circuit of the second embodiment of the present invention. Referring to FIG. 7, the second embodiment of the present invention provides a first variable delay circuit 1, a second variable delay circuit 2, a first phase comparator 5 that compares the phase of a reference signal 102 to the phase of a feedback signal 103, a second phase comparator 6 that compares the phases of the first and second variable delay circuits 1 and 2, a switching circuit 7 that switches the output of the first and second variable delay circuits 1, 2, and a control circuit 4. Comparing the second embodiment of the present invention to the first embodiment, the second embodiment provides two variable delay circuits.

First, the second variable delay circuit 2 is selected as the path from the input 100 to output 101. At this time, the phase of the output of the first variable delay circuit 1 is controlled so as to differ by one cycle from the phase of the output of the second variable delay circuit 2.

When the delay time of the second variable circuit 2 reaches the maximum value or minimum value of the variable delay time range, by assigning the first variable delay circuit 1 to the path from the input 100 to the output 101, phase compensation greater than the variable delay time range of the variable delay circuit is possible. In this manner, the second embodiment of the present invention can attain an effect substantially equivalent to that of the first embodiment. Furthermore, the circuit scale can be made smaller than that of the above-described first embodiment.

Figure 8:
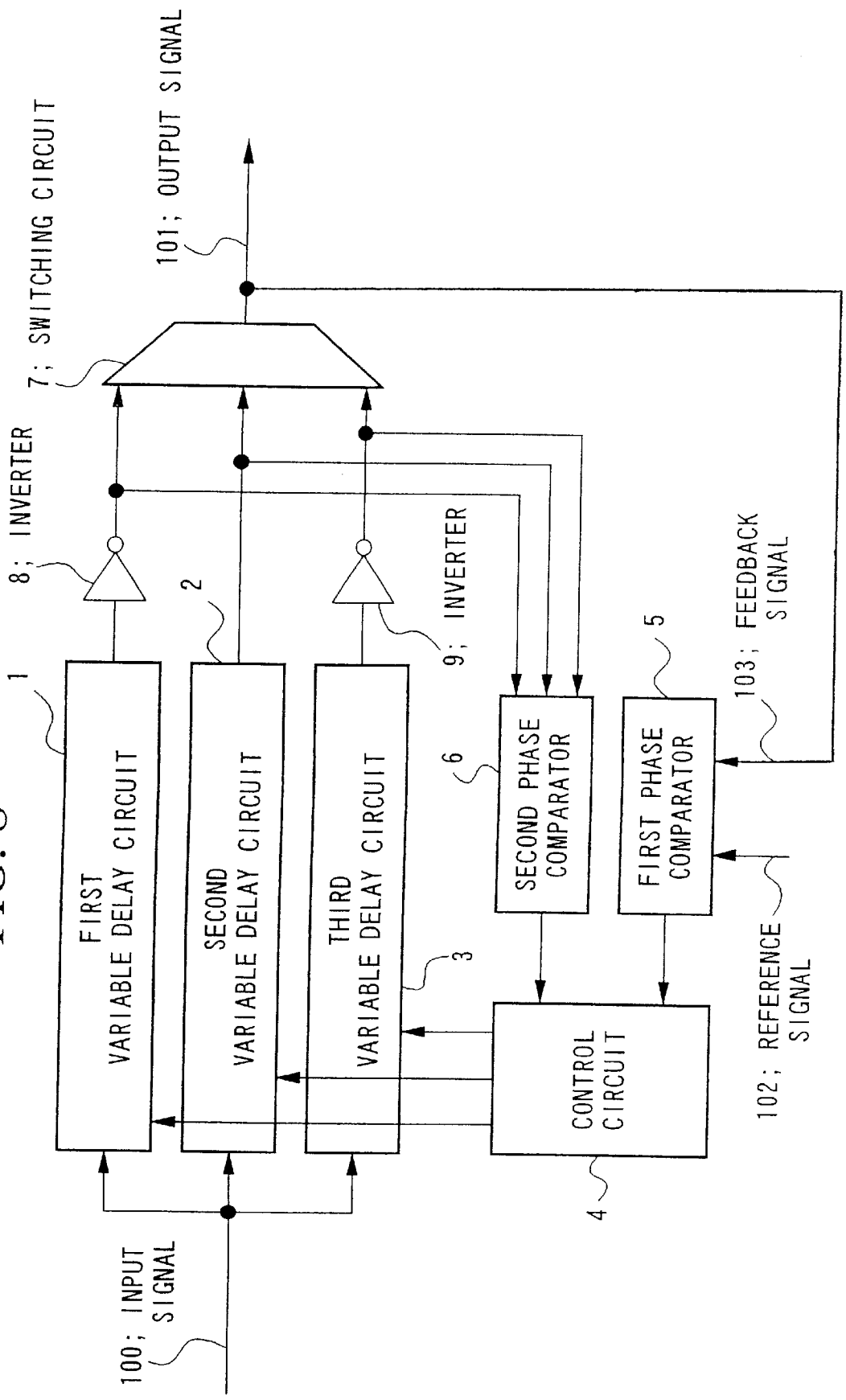
FIG. 8 is a drawing showing a third embodiment of the present invention.

Next, a third embodiment of the present invention will be explained. FIG. 8 is a drawing showing the structure of a phase compensation circuit of a third embodiment of the present invention. Referring to FIG. 8, the third embodiment of the present invention provides a first variable delay circuit 1, a second variable delay circuit 2, a third variable delay circuit 3, a first phase comparator 5 that compares the phase of the reference signal 102 to the phase of the feedback signal 103, a second phase comparator 6 that compares the phases of the first to third variable delay circuits 1, 2, and 3, a switching circuit 7 that switches the outputs of the first to third variable delay circuits 1, 2, and 3, and a control circuit 4. The output of the first variable delay circuit 1 and the output of the third variable delay circuit 3 are input into the stitching circuit 71 and the second phase comparator 6 respectively via the inverters 8 and 9.

Here, we assume that the second variable delay circuit 2 is selected as the path from the input 100 to the output 101. At this time, the phase of the signal that is the inverted output of the first variable delay circuit 1 and the phase of the output of the second variable delay circuit 2 are controlled so as to differ by one cycle. That is, the phases of the output of the first variable delay circuit 1 and the output of the second variable delay circuit 2 are controlled so as to differ by ½ cycle. In addition, the phase of the signal that is the inverted output of the third variable delay circuit 3 and the output of the second variable delay circuit 2 are controlled so as to differ by one cycle. That is, the phases of the output of the third variable delay circuit 3 and the output of the second variable delay circuit 2 are controlled so as to differ by ½ cycle.

When the second delay circuit 2 reaches, the maximum value or minimum value of the variable delay time range, by respectively assigning the output that is the inverted output of the first variable delay circuit 1 or the output that is the inverted output of the third variable delay circuit 3 to the path from the input to the output, phase compensation greater than the variable time delay range of the variable delay circuit is possible. Therefore, in the third embodiment of the present invention as well, an effect equivalent to that of the above-described first embodiment can be attained. Furthermore, the variable delay time range can be reduced to less than that of the above described first embodiment.

Figure 9:
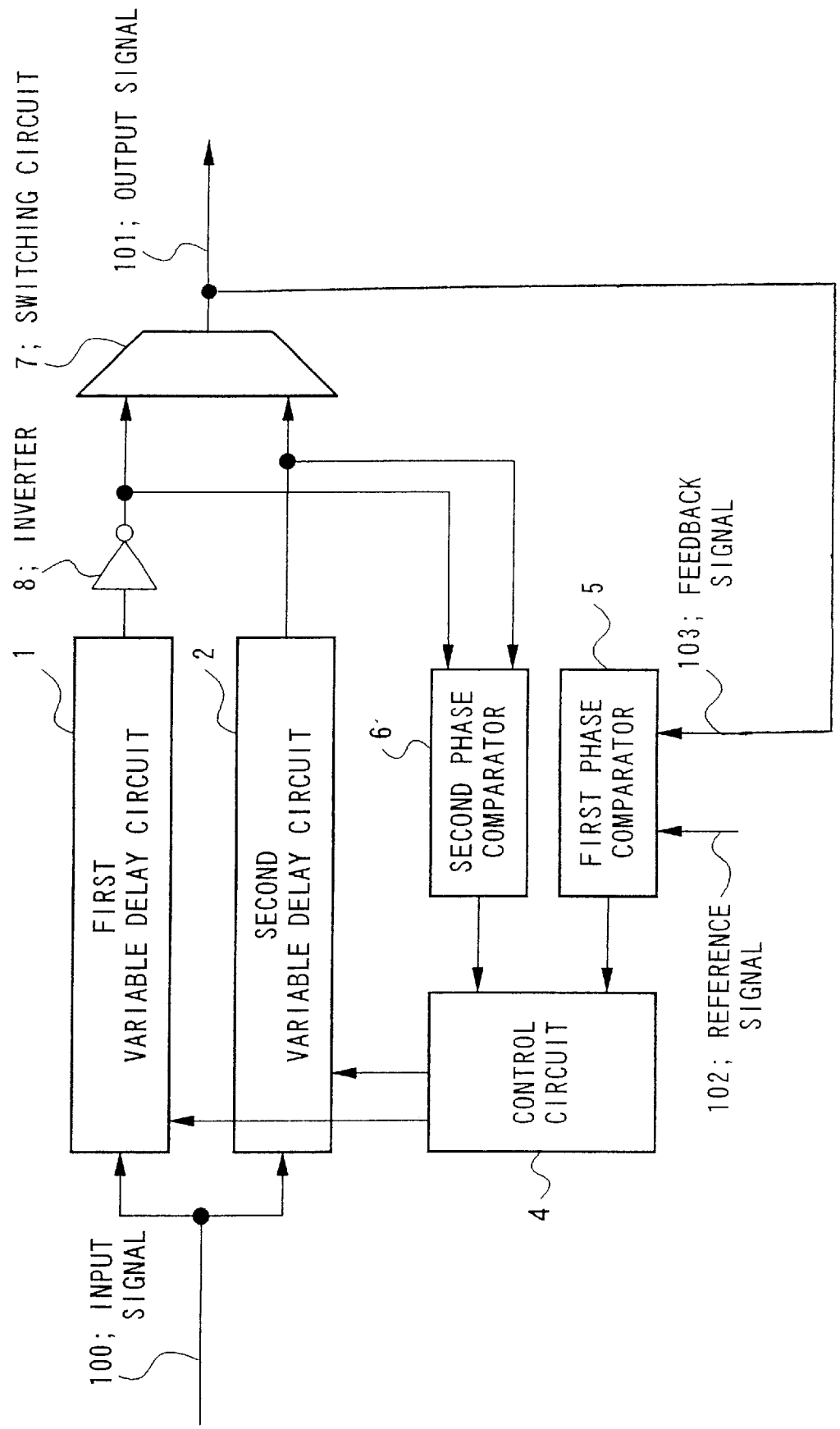
FIG. 9 is a drawing showing a fourth embodiment of the present invention.
Figure 10:
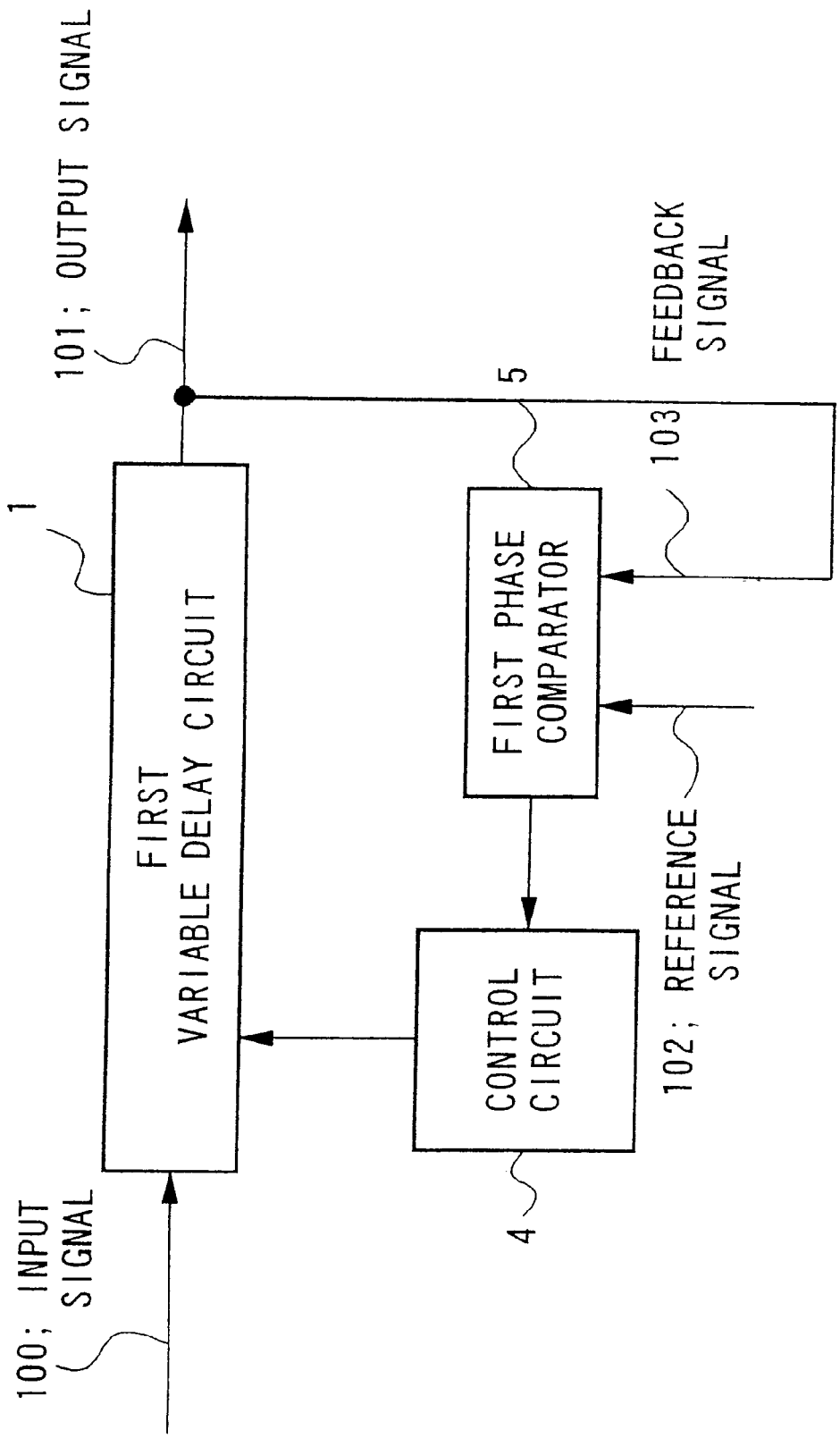
FIG. 10 is a drawing showing the structure of a conventional phase compensation circuit.
Figure 11:
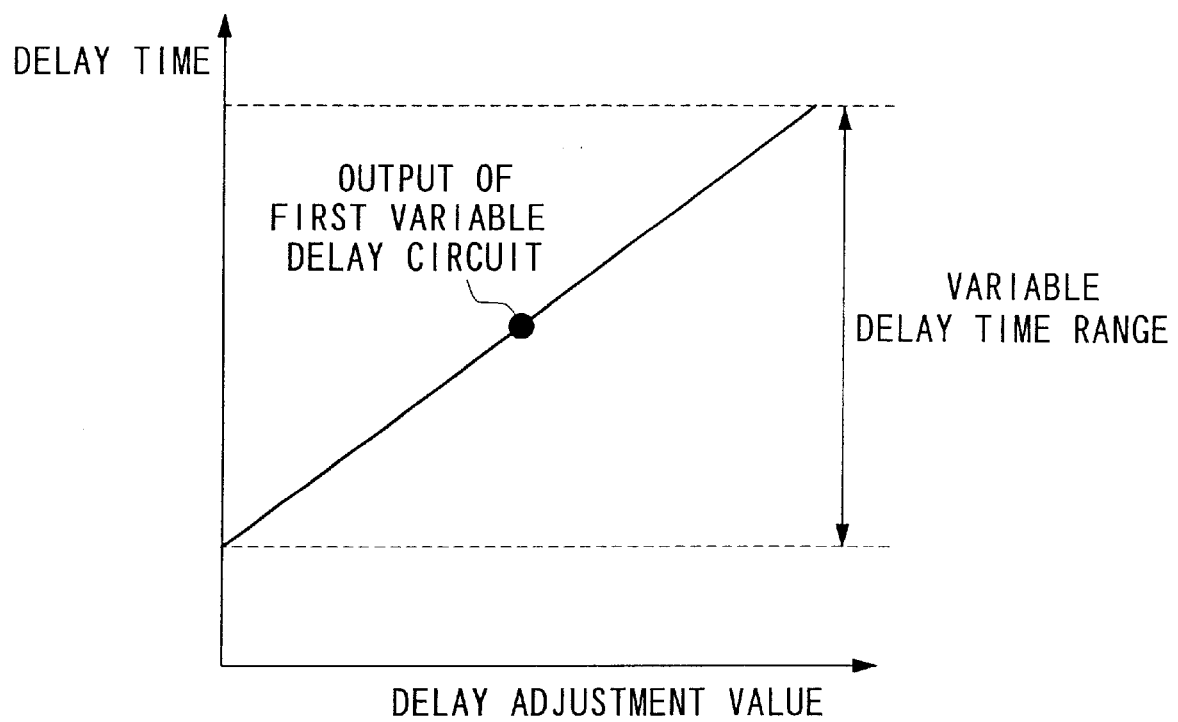
FIG. 11 is a drawing showing the operational characteristics of a conventional phase compensation circuit.

Next, a fourth embodiment of the present invention will be explained. FIG. 9 is a drawing showing the structure of a phase compensation circuit of a fourth embodiment of the present invention. Referring to FIG. 9, the fourth embodiment of the present invention provides a first variable delay circuit 1, a second variable delay circuit 2, a first phase comparator 5 that compares the phase of the reference signal 102 and the phase of the feedback signal 103, a second phase comparator 6 that compares the phases of the first and second variable delay circuits 1 and 2, a switching circuit 7 that switches the outputs of the first variable delay circuit 1 and the second variable delay circuit 2, and a control circuit. The output of the first variable delay circuit 1 is input into the switching circuit 7 and the second phase comparator 6 via inverter 8.

We assume that the second variable delay circuit 2 is selected as the path from the input 100 to the output 101. Here, the phases of the output of the signal that is the inverted output of the first variable delay circuit 1 and the output of the second variable delay circuit 2 are controlled so as to differ by one cycle. That is, the phase of the output of the first variable delay circuit 1 and the phase of the output of the second variable delay circuit 2 are controlled so as to differ by ½ cycle (180°). When the maximum or minimum value of the variable time delay range of the second variable delay circuit 2 is reached, by assigning the first variable delay circuit 1 to the path from the input to the output, phase compensation greater than the variable delay time range of the variable delay circuit is possible. Therefore, in the fourth embodiment of the present invention as well, an effect equivalent to that of the third embodiment can be attained. Furthermore, both the circuit scale and the variable delay time range can be made smaller than those of the third embodiment.

What is claimed is:

1. A phase compensation circuit comprising:

three variable delay circuits whose output signal phases differ from each other by a specified phase difference;

a switching circuit that selects one variable delay circuit from among said three delay circuits;

a first comparator that compares a feedback signal representative of a phase of an output signal of said one selected variable delay circuit to the phase of a specified reference signal;

a second comparator that compares the phases of the output signals of said three variable delay circuits to each other; and a control circuit that, based on the results of the comparison by said second phase comparator, controls delay times of one of non-selected two variable delay circuits so that the phase of the output signal of said one non-selected variable delay circuit is ahead of the phase of the output signal of said selected variable delay circuit by said specified phase difference and controls delay times of the other of non-selected two variable delay circuits so that the phase of the output signal of the other non-selected variable delay circuit is behind the phase of the output signal of said selected variable delay circuit by said specified phase difference and, based on the results of the comparison by said first phase comparator, controls a delay time of said selected variable delay circuit so that the phase of the output signal of said selected variable delay circuit is the same as the phase of said reference signal, and if said delay time of said selected variable delay circuit exceeds a variable time delay range of said selected variable delay circuit, controls said switching circuit so as to select another variable delay circuit.

2. A phase compensation circuit according to claim 1 wherein:

said specified phase difference is one cycle.

3. A phase compensation circuit according to claim 1 wherein:

said specified phase difference is ½ cycle.

* * * * *

UNITED STATES PATENT AND TRADEMARK OFFICE
CERTIFICATE OF CORRECTION

PATENT NO. : 6,486,716 B1 Page 1 of 1
DATED : November 26, 2002
INVENTOR(S) : Koichiro Minami et al.

It is certified that error appears in the above-identified patent and that said Letters Patent is hereby corrected as shown below:

<u>Title page,</u>
Insert Item -- [30]   Foreign Application Priority Data
            September 8, 1999  (JP)......11-853846 --.

Signed and Sealed this

Ninth Day of May, 2006

JON W. DUDAS
*Director of the United States Patent and Trademark Office*

UNITED STATES PATENT AND TRADEMARK OFFICE
CERTIFICATE OF CORRECTION

PATENT NO.         : 6,486,716 B1                                           Page 1 of 1
APPLICATION NO. : 09/654625
DATED              : November 26, 2002
INVENTOR(S)        : Koichiro Minami et al.

It is certified that error appears in the above-identified patent and that said Letters Patent is hereby corrected as shown below:

<u>Title page,</u>
Insert Item -- [30]   Foreign Application Priority Data
        September 8, 1999  (JP)......11-253846 --.

This certificate supersedes Certificate of Correction issued May 9, 2006.

Signed and Sealed this

Fourteenth Day of November, 2006

JON W. DUDAS
*Director of the United States Patent and Trademark Office*